(12) United States Patent
Hung et al.

(10) Patent No.: US 9,929,134 B2
(45) Date of Patent: Mar. 27, 2018

(54) SEMICONDUCTOR DEVICE AND METHOD FOR FILLING PATTERNS

(71) Applicant: UNITED MICROELECTRONICS CORP., Hsin-Chu (TW)

(72) Inventors: Ching-Wen Hung, Tainan (TW); Chih-Sen Huang, Tainan (TW); Yi-Wei Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/817,186

(22) Filed: Aug. 3, 2015

(65) Prior Publication Data

US 2017/0012033 A1    Jan. 12, 2017

(30) Foreign Application Priority Data

Jul. 7, 2015   (CN) .......................... 2015 1 0392020

(51) Int. Cl.
*H01L 27/02*    (2006.01)
*H01L 27/088*   (2006.01)
*H01L 21/8234*  (2006.01)

(52) U.S. Cl.
CPC .. *H01L 27/0207* (2013.01); *H01L 21/823431* (2013.01); *H01L 21/823437* (2013.01); *H01L 21/823475* (2013.01); *H01L 27/0886* (2013.01)

(58) Field of Classification Search
CPC ...................... H01L 29/7858; H01L 29/41791
See application file for complete search history.

(56) References Cited

U.S. PATENT DOCUMENTS

| | | | |
|---|---|---|---|
| 2004/0169269 A1* | 9/2004 | Yeo ................... | H01L 29/41791 257/692 |
| 2005/0274983 A1* | 12/2005 | Hayashi .............. | G06F 17/5072 257/206 |
| 2006/0228862 A1* | 10/2006 | Anderson ....... | H01L 21/823425 438/279 |
| 2007/0020858 A1* | 1/2007 | Yang ................... | H01L 27/0203 438/275 |
| 2007/0111405 A1* | 5/2007 | Watanabe ........... | H01L 27/0207 438/142 |
| 2008/0296699 A1* | 12/2008 | Hong .............. | H01L 21/823437 257/390 |
| 2009/0152649 A1* | 6/2009 | Kim .................... | H01L 29/0619 257/409 |
| 2011/0227188 A1* | 9/2011 | Wang .................. | H01L 27/0207 257/499 |

(Continued)

OTHER PUBLICATIONS

Hung, Title of Invention: Method for Manufactruing a Contact Structure Used to Electrically Connect a Semiconductor Device, U.S. Appl. No. 14/510,100, filed Oct. 8, 2014.

*Primary Examiner* — Bryan Junge
(74) *Attorney, Agent, or Firm* — Winston Hsu

(57) ABSTRACT

A semiconductor device is disclosed. The semiconductor device includes: a substrate having a cell region defined thereon, in which the cell region includes a first edge and a second edge extending along a first direction; and a plurality of patterns on the substrate extending along the first direction, in which the patterns includes a plurality of first patterns and a plurality of second patterns, and one of the first patterns closest to the first edge and one of the second patterns closest to the second edge are different.

6 Claims, 4 Drawing Sheets

(56) References Cited

U.S. PATENT DOCUMENTS

| | | | | |
|---|---|---|---|---|
| 2014/0117454 A1* | 5/2014 | Liu | ................... | H01L 29/6681 257/368 |
| 2016/0043222 A1* | 2/2016 | Cho | ................... | H01L 29/7845 257/369 |
| 2016/0049395 A1* | 2/2016 | Okagaki | ............ | G06F 17/5077 257/401 |

* cited by examiner

US 9,929,134 B2

1

SEMICONDUCTOR DEVICE AND METHOD FOR FILLING PATTERNS

BACKGROUND OF THE INVENTION

1. Field of the Invention

The invention relates to a semiconductor device, and more particularly, to a semiconductor device having asymmetrical patterns on a cell region of a substrate.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the FinFET can be controlled by adjusting the work function of the gate.

Typically, unit cell regions or cell regions containing multiple patterns such as gate patterns and contact plug patterns from FinFET devices are formed on semiconductor substrate, in which the patterns closest to the edges of the cell region are arranged symmetrically. For instance, the pattern closest to the left edge of the cell region is usually the same as the pattern closest to the right edge of the cell region. This design however often creates excessive empty regions between adjacent cell regions thereby affecting the profile of the device. Hence, how to improve this issue has become an important task in this field.

SUMMARY OF THE INVENTION

According to a preferred embodiment of the present invention, a semiconductor device is disclosed. The semiconductor device includes: a substrate having a cell region defined thereon, in which the cell region includes a first edge and a second edge extending along a first direction; and a plurality of patterns on the substrate extending along the first direction, in which the patterns includes a plurality of first patterns and a plurality of second patterns, and one of the first patterns closest to the first edge and one of the second patterns closest to the second edge are different.

According to another aspect of the present invention, a method for filling patterns is disclosed. The method includes the steps of: providing a substrate having a cell region defined thereon; forming main patterns on the substrate and within the cell region; and filling first dummy patterns adjacent to the main patterns, in which each of the first dummy patterns comprises a first length along x-direction between 2 µm to 5 µm and a second length along y-direction between 3 µm to 5 µm.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
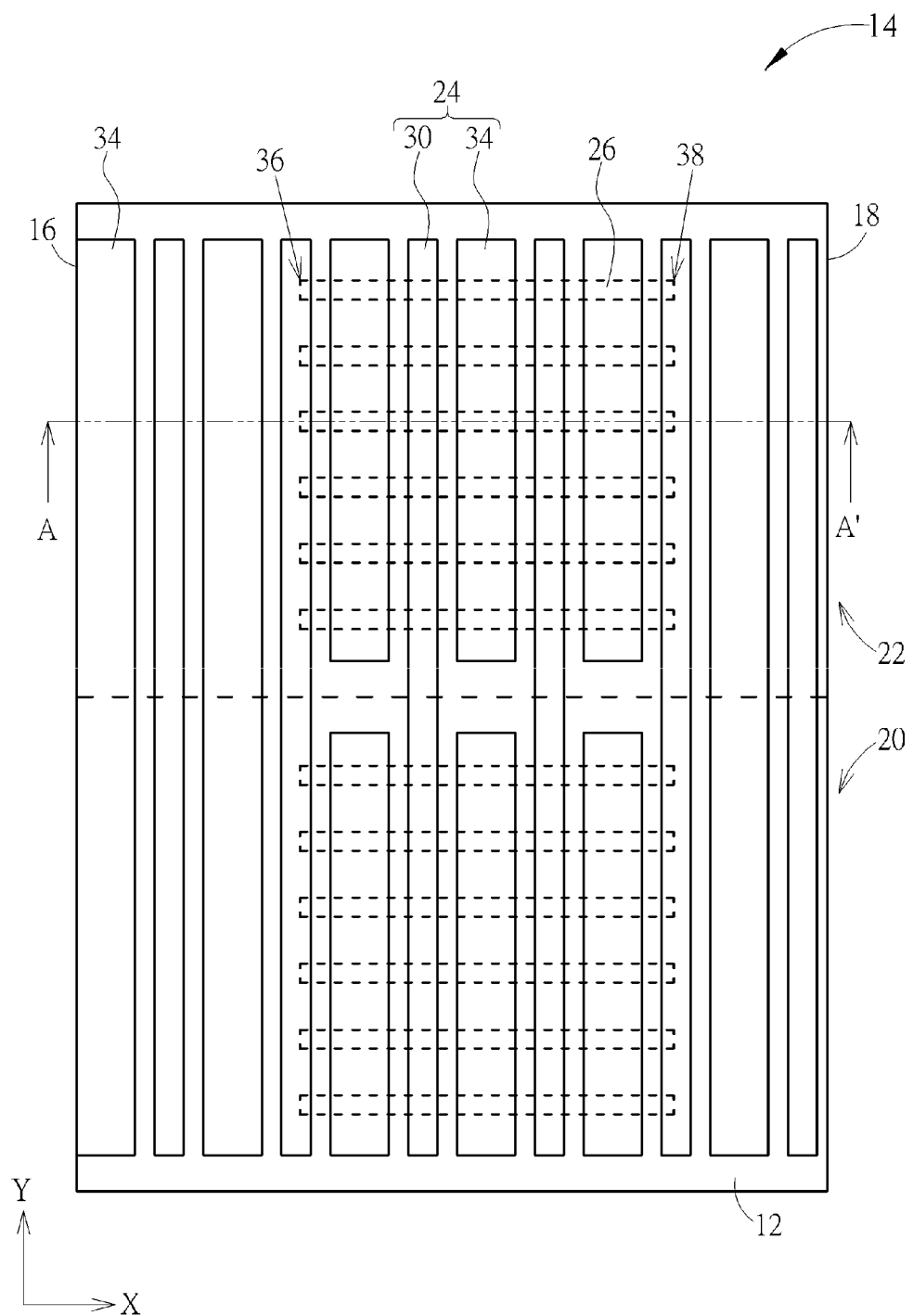
FIG. 1 illustrates a top view of a semiconductor device according to a preferred embodiment of the present invention.
Figure 2:
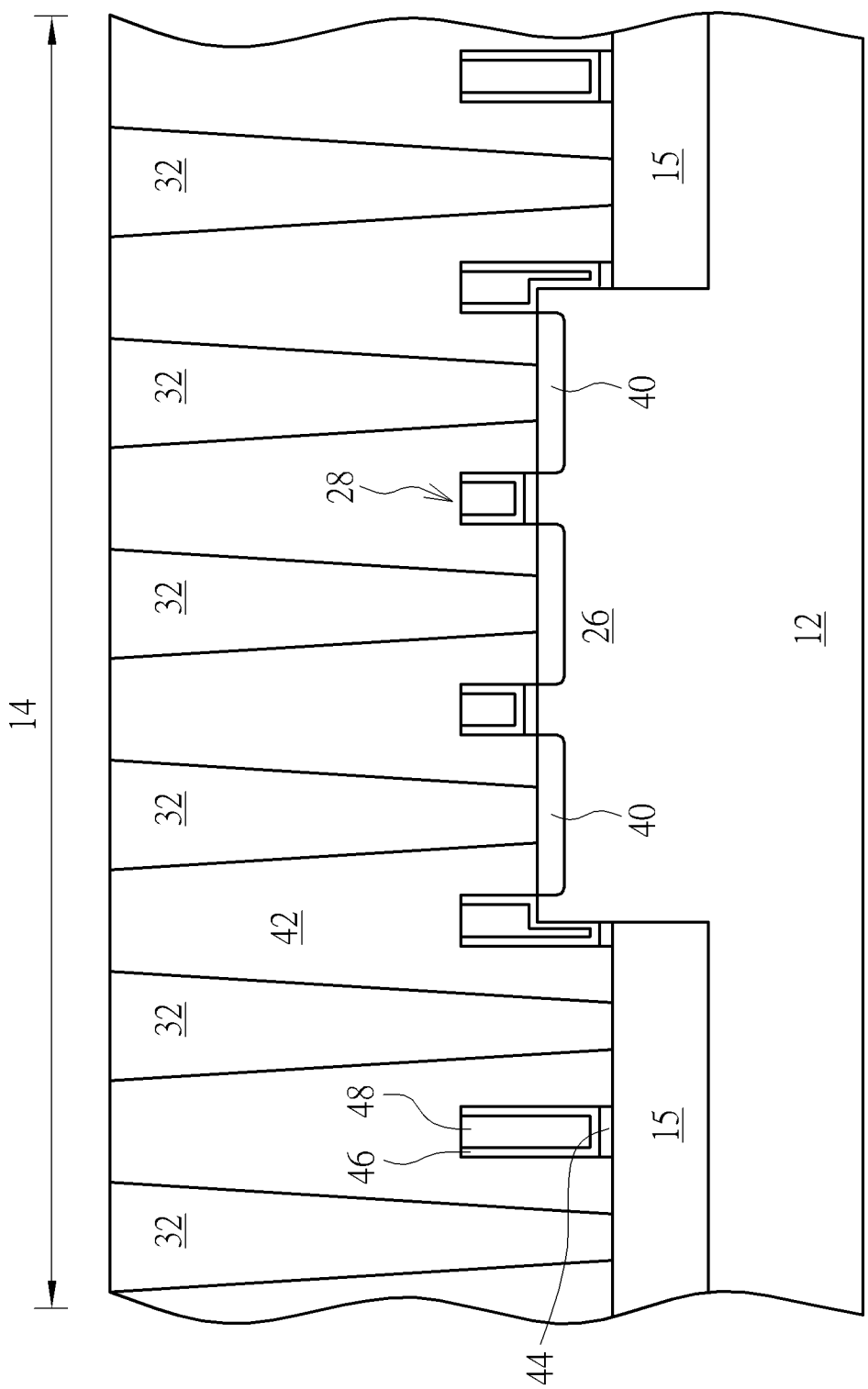
FIG. 2 illustrates a cross-sectional view of FIG. 1 along the sectional line AA'.

Referring to FIGS. 1-2, FIG. 1 illustrates a top view of a semiconductor device according to a preferred embodiment of the present invention, FIG. 2 illustrates a cross-sectional view of FIG. 1 along the sectional line AA'. As shown in FIGS. 1-2, the semiconductor device of the present invention includes a substrate 12, such as a silicon wafer or silicon substrate composed of semiconductor material, in which a unit cell region or cell region 14 is defined on the substrate 12. The cell region 14 includes two side edges, such as a first edge 16 on the left and a second edge 18 on the right, in which both the first edge 16 and second edge 18 are extending along a first direction.

A NMOS region 20 and a PMOS region 22 are also defined on the cell region 14, and each of the NMOS region 20 and the PMOS region 22 further includes a plurality of patterns 24 extending along the first direction and a plurality of fin-shaped structures 26 extending along a second direction and intersecting part of the patterns 24, in which the first direction could be a Y-direction while the second direction could be an X-direction. In this embodiment, the patterns 24 primarily include two types of patterns extending in the same direction and arranged in an alternating manner. For instance the patterns 24 are composed of gate patterns 30 constituted by gate structures 28 of FinFET devices and contact plug patterns 34 constituted by contact plugs 32, but not limited thereto.

Specifically, the pattern closest to the first edge 16 and the pattern closest to the second edge 18 within the cell region 14 are preferably different patterns. For instance, as shown in the top view of FIG. 1, the pattern closest to the first edge 16 is a contact plug pattern 34 while the pattern closest to the second edge 18 is a gate pattern. It should be noted that even though a contact plug pattern is disposed closest to the first edge 16 on the left side of cell region 14 and a gate pattern 30 is disposed closest to the second edge 18 on the right in this embodiment, it would also be desirable to adjust the position of the patterns 24 by disposing a gate pattern 30 closest to the first edge 16 on the left and a contact plug pattern 34 closest to the second edge 18 on the right, which is also within the scope of the present invention.

It should also be noted that even though the contact plug pattern 34 closest to the first edge 16 on the left is aligned to the first edge 16 while the gate pattern 30 closest to the second edge 18 on the right is not aligned to the second edge 18, it would also be desirable to not align the leftmost contact plug pattern 34 to the first edge 16 while inserting a gap between the leftmost contact plug pattern 34 and the first edge 16, or align the leftmost contact plug pattern 34 to the first edge 16 and align the rightmost gate pattern 30 to the second edge 18 at the same time, or not align the leftmost contact plug pattern 34 to the first edge 16 and not align the rightmost gate pattern 30 to the second edge 18 at the same time, which are all within the scope of the present invention.

Moreover, the two types of patterns 24 are preferably disposed alternately on cell region 14, in which the gate patterns 30 and contact plug patterns 34 are arranged alternately along the first direction. If relative position of the patterns 24 and fin-shaped structures 26 were taken into account, each fin-shaped structure 26 preferably includes a first end 36 and a second end 38, and the quantity of the patterns between the pattern 24 contacting the first end 36 and the first edge 16 and the quantity of patterns between the pattern 24 contacting the second end 38 and the second edge 18 are different. For instance, a total of four patterns are revealed between the pattern 24 contacting the first end 36 and the first edge 16 in the embodiment shown in FIG. 1, which preferably includes two gate patterns 30 and two contact plug patterns 34, and a total of three patterns are revealed between the pattern 24 contacting the second end 38 and the second edge 18, which includes two gate patterns 30 and one contact plug pattern 34.

Viewing from a more detailed perspective, such as shown in both FIGS. 1-2, the semiconductor device includes a plurality of fin-shaped structures 26 on the substrate 12, a plurality of gate structures 28 on the substrate 28 while part of the gate structures 28 intersecting the fin-shaped structures 26, a plurality of doped regions 40 in the fin-shaped structures 26 adjacent to two sides of the gate structures 28 to serve as source/drain regions, an interlayer dielectric (ILD) layer 42 on the substrate 12 to cover the gate structures 28, and a plurality of contact plugs 32 on the fin-shaped structures 26 and shallow trench isolation (STI) 15. It should also be noted that even though not revealed in FIG. 2, a spacer (not shown) could be formed on the sidewalls of the gate structures 28, an epitaxial layer (not shown) and silicides (not shown) could be formed in the fin-shaped structures 26 adjacent to the gate structures 28, and a contact etch stop layer (CESL) (not shown) could be formed on the substrate 12 surface to cover the gate structures 28.

The formation of the gate structure 28 could be accomplished by a gate first process, a high-k first approach from gate last process, or a high-k last approach from gate last process. Since this embodiment pertains to a high-k first approach, each of the gate structures 28 could include an interfacial layer (not shown) on the substrate 12, a high-k dielectric layer 44 on the interfacial layer, a work function metal layer 46 on the high-k dielectric layer 44, and a low resistance metal layer 48 on the work function metal layer 46, in which the work function metal layer 46 is U-shaped.

The high-k dielectric layer 44 could be a single-layer or a multi-layer structure containing metal oxide layer such as rare earth metal oxide, in which the dielectric constant of the high-k dielectric layer 44 is substantially greater than 20. For example, the high-k dielectric layer 44 could be selected from the group consisting of hafnium oxide ($HfO_2$), hafnium silicon oxide (HfSiO), hafnium silicon oxynitride (HfSiON), aluminum oxide (AlO), lanthanum oxide ($La_2O_3$), lanthanum aluminum oxide (LaAlO), tantalum oxide, $Ta_2O_3$, zirconium oxide ($ZrO_2$), zirconium silicon oxide (ZrSiO), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST).

In this embodiment, the work function metal layer 46 is formed for tuning the work function of the later formed metal gates to be appropriate in an NMOS or a PMOS. For an NMOS transistor, the work function metal layer 46 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 46 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 46 and the low resistance metal layer 48, in which the material of the barrier layer may include titanium (Ti), titanium nitride (TiN), tantalum (Ta) or tantalum nitride (TaN). Furthermore, the material of the low-resistance metal layer 48 may include copper (Cu), aluminum (Al), titanium aluminum (TiAl), cobalt tungsten phosphide (CoWP) or any combination thereof.

The contact plugs 32 could include a barrier layer selected from the group consisting of Ti, TiN, Ta, and TiN, and a low resistance metal layer selected from the group consisting of W, Cu, Al, TiAl, and CoWP.

Figure 3:
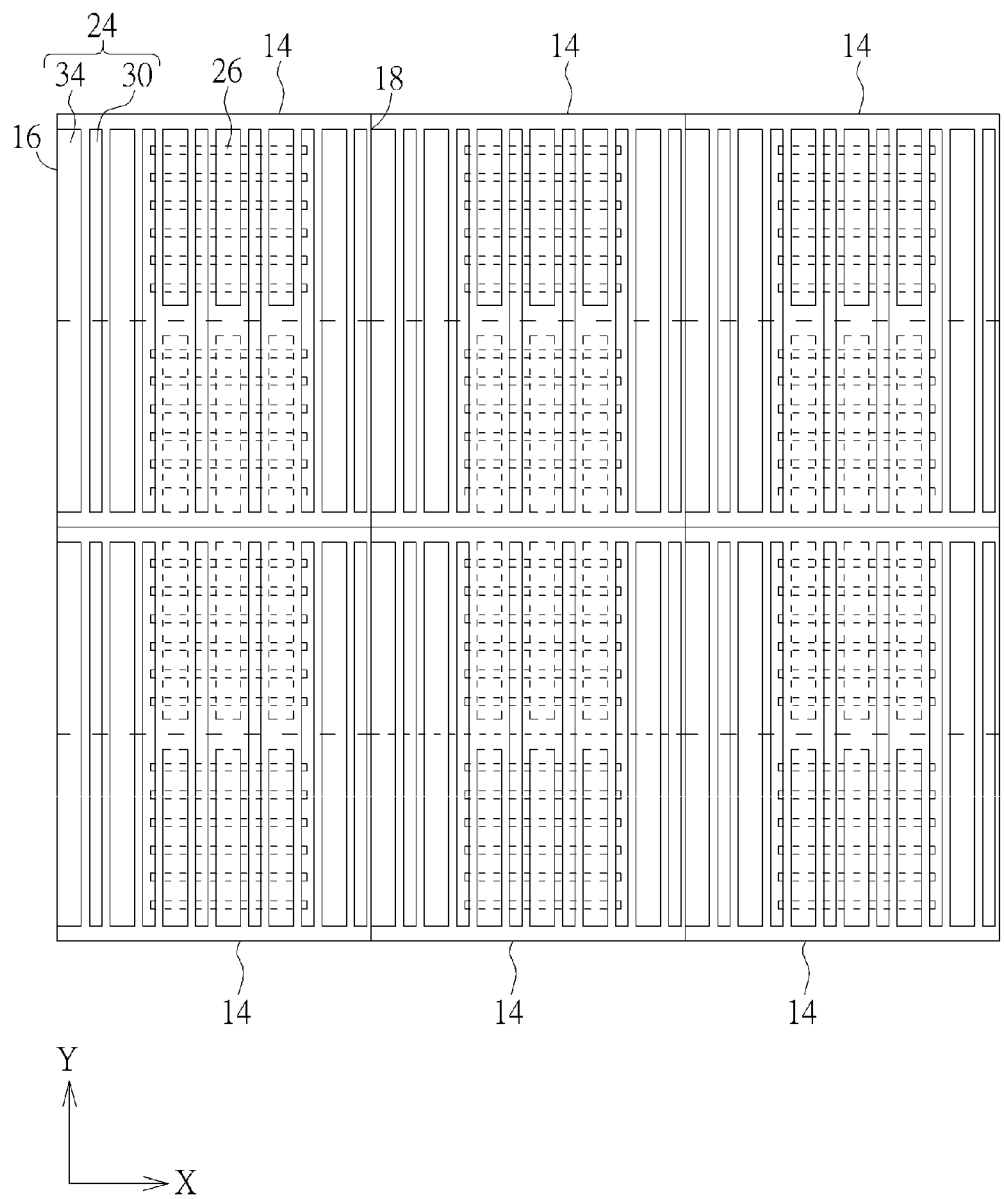
FIG. 3 illustrates a top view of a semiconductor device according to another embodiment of the present invention.

Referring to FIG. 3, FIG. 3 illustrates a top view of a semiconductor device according to another embodiment of the present invention. As shown in FIG. 3, a plurality of cell regions 14 such as shown in FIG. 1 could be defined on the substrate of a semiconductor device. Similar to the cell region 14 from FIG. 1, each of the cell regions 14 in FIG. 3 includes a first edge 16 and a second edge 18, a plurality of patterns 24 extending along a first direction such as Y-direction, a plurality of fin-shaped structures 26 extending along a second direction such as X-direction and intersecting part of the patterns 24, and the pattern closest to the first edge 16 and the pattern closest to the second edge 18 are preferably different patterns. In this embodiment, the pattern closest to the first edge 16 is a contact plug pattern 34 and the pattern closest to the second edge 18 is a gate pattern 30. Overall, the patterns on left side and right side of either a first edge 16 or second edge 18 between any two adjacent cell regions 14 are preferably different patterns.

Figure 4:
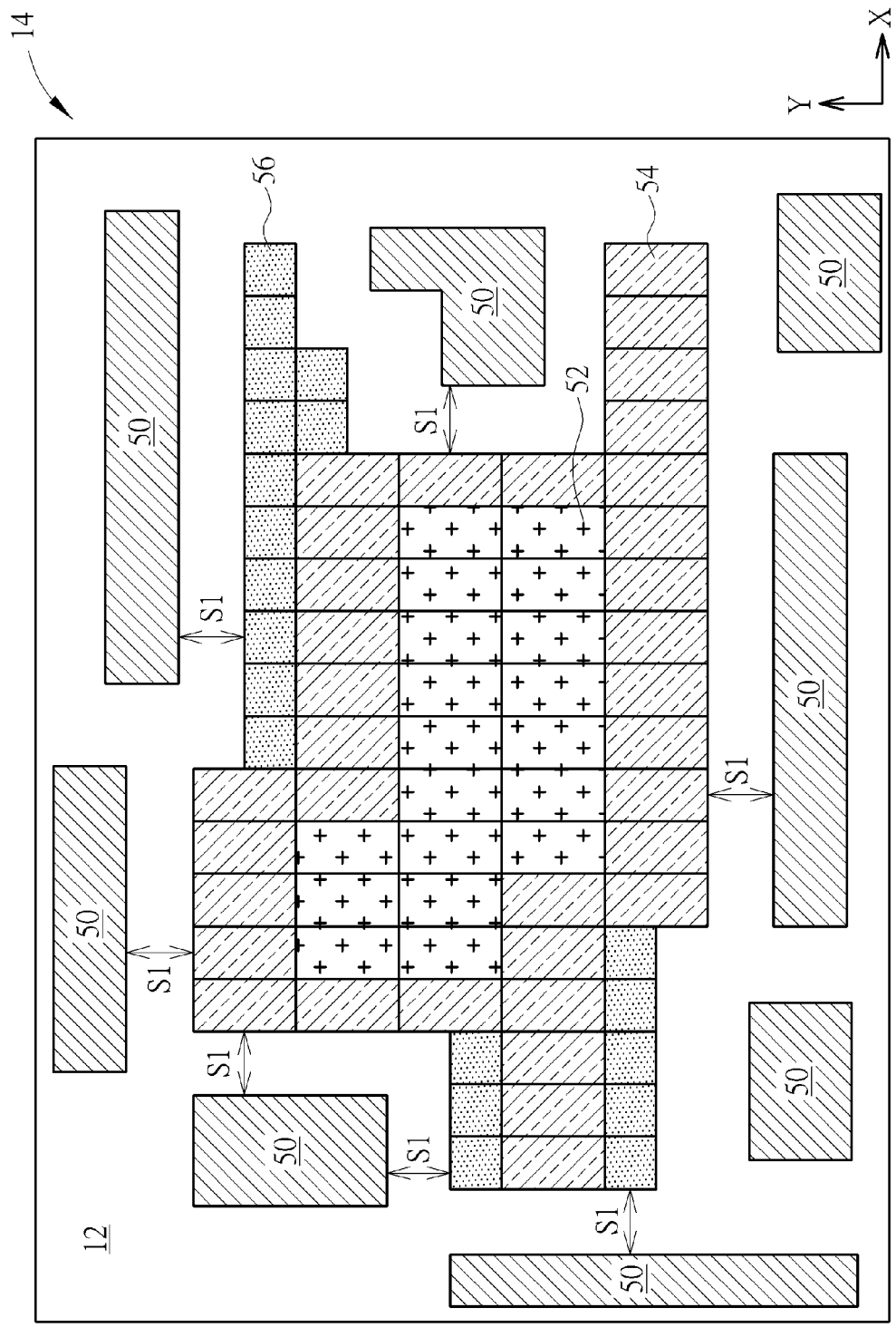
FIG. 4 illustrates a method for filling patterns according to an embodiment of the present invention.

Referring to FIG. 4, FIG. 4 illustrates a method for filling patterns according to an embodiment of the present invention. As shown in FIG. 4, a substrate 12 is first provided, and a cell region 14 is defined on the substrate 12. A plurality of main patterns 50 are then formed on the substrate 12 and within the cell region 14, in which the main patterns 50 could include gate patterns 30 constituted from gate structures 28 of aforementioned FinFET device or contact plug patterns 34 constituted from contact plugs 32.

Next, a plurality of first dummy patterns 52 are filled adjacent to the main patterns 50, in which each of the first dummy patterns 52 does not contact with the main patterns 50 while the first dummy patterns 52 contact each other directly, and each first dummy pattern 52 includes a first length extending along X-direction and a second length extending along Y-direction. In this embodiment, the first length of each first dummy pattern 52 along X-direction is between 2 μm to 5 μm and the second length along Y-direction is between 3 μm to 5 μm.

After filling the first dummy patterns 52, a plurality of second dummy patterns 54 could be selectively filled adjacent to the first dummy patterns 52, in which the second dummy patterns 54 contact the first dummy patterns 52 directly but do not contact the main patterns 50, and each of the second dummy patterns 54 includes a third length extending along X-direction and a fourth length extending along Y-direction. In this embodiment, the third length of each second dummy pattern 54 along X-direction is between 0.8 μm to 1.2 μm and the fourth length along Y-direction between 1 μm to 2 μm.

If there were still empty spaces available after filling the second dummy patterns 54, a plurality of third dummy patterns 56 could be filled adjacent to the second dummy patterns 54, in which the third dummy patterns 56 contact the second dummy patterns 54 directly but do not contact the main patterns 50, and each of the third dummy patterns 56 includes a fifth length extending along X-direction and a sixth length extending along Y-direction. In this embodiment, the fifth length of each third dummy pattern 56 along X-direction is between 0.8 μm to 1.2 μm and the sixth length along Y-direction is between 0.6 μm to 1 μm. It should also be noted that a minimal spacing S1 is created or formed between the first dummy patterns 52, second dummy patterns 54, or third dummy patterns 56 and the main patterns 50, in which the minimal spacing S1 is preferably between 0.2 μm to 0.8 μm.

Overall, the present invention discloses a semiconductor device structure, which preferably disposes a plurality of patterns within a cell region of a substrate and the pattern closest to a first edge of the cell region is preferably different from the pattern closest to a second edge of the cell region. According to a preferred embodiment of the present invention, the patterns disposed in the cell region includes gate patterns and contact plug patterns, in which the gate patterns and the contact plug patterns are arranged alternately and extending along the direction of the first edge and second edge. By arranging the gate patterns and contact plug patterns in the cell region asymmetrically, it would be desirable to reduce the number of empty regions generated between adjacent cell regions thereby improving the overall profile of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a cell region defined thereon, wherein the cell region comprises a first edge and a second edge extending along a first direction;
   a plurality of patterns on the substrate extending along the first direction, wherein the patterns comprises a plurality of first patterns and a plurality of second patterns, and a top edge and a bottom edge of the plurality of first patterns are aligned with a top edge and a bottom edge of the plurality of second patterns along a second direction; and
   fin-shaped structures extending along the second direction intersecting part of the patterns, wherein one of the first patterns closest to the first edge and one of the second patterns closest to the second edge without intersecting the fin-shaped structures comprise equal length and different widths.

2. The semiconductor device of claim 1, wherein the patterns comprise gate patterns and contact plug patterns.

3. The semiconductor device of claim 1, wherein the first patterns comprise gate patterns and the second patterns comprise contact plug patterns.

4. The semiconductor device of claim 1, wherein the first patterns comprise contact plug patterns and the second patterns comprise gate patterns.

5. The semiconductor device of claim 1, wherein each of the fin-shaped structures comprises a first end and a second end, and the quantity of the patterns between the pattern contacting the first end and the first edge and the quantity of the patterns between the pattern contacting the second end and the second edge are different.

6. The semiconductor device of claim 1, wherein the first patterns and the second patterns are arranged alternately.

* * * * *